United States Patent [19]

Ishikawa

[11] Patent Number: 5,014,003

[45] Date of Patent: May 7, 1991

[54] CONDUCTIVE PATTERN FOR ELECTRIC TEST OF SEMICONDUCTOR CHIPS

[75] Inventor: Michihiro Ishikawa, Kitakami, Japan

[73] Assignee: Kabushiki Kaisha Toshiba, Kawasaki, Japan

[21] Appl. No.: 299,336

[22] Filed: Jan. 23, 1989

[30] Foreign Application Priority Data

Jan. 20, 1988 [JP] Japan .................................. 63-10030

[51] Int. Cl.⁵ ...................... G01R 31/02; G01R 31/28
[52] U.S. Cl. ............................... 324/158 P; 324/73.1; 324/158 R; 324/158 F
[58] Field of Search ........... 324/158 F, 158 P, 73 PC, 324/65 R, 158 R, 73.1, 500; 340/652; 437/8

[56] References Cited

U.S. PATENT DOCUMENTS

| 3,781,683 | 12/1973 | Freed | 324/73.1 |
| 3,974,443 | 8/1976 | Thomas | 324/65 R |
| 4,266,191 | 5/1981 | Spano et al. | 324/158 F |
| 4,386,459 | 6/1983 | Boulin | 324/158 R |
| 4,801,869 | 1/1989 | Sprogis | 324/158 R |

Primary Examiner—Kenneth Wieder
Assistant Examiner—Vinh P. Nguyen
Attorney, Agent, or Firm—Foley & Lardner

[57] ABSTRACT

A conductive pattern for electric test of a semiconductor chip with which probes are in contact is disclosed. The pattern has a plurality of probing pads for electric test and at least two unit continuity check patterns provided within an area for determining alignment of the probes with the probing pads. Each of the unit continuity check patterns has a plurality of conductive pads and a conductive line connecting the pads.

9 Claims, 2 Drawing Sheets

CONDUCTIVE PATTERN FOR ELECTRIC TEST OF SEMICONDUCTOR CHIPS

BACKGROUND OF THE INVENTION

This invention relates to a conductive pattern for electric test of semiconductor chips, and more particularly to a check pattern used in aligning probes with probing pads during wafer probing.

In general, in the final stage of manufacturing semiconductor devices, for example, when the wafer process is completed, various electric tests for determining pass/fail of semiconductor chips are performed by contacting the probes of a testing apparatus to probing pads provided in the periphery of a semiconductor chip formed on a wafer.

Aligning the probes with the pads is performed by observing the relationship of their positions with a microscope disposed above the pads of the semiconductor chip.

In the alignment, if an area having the probes is small, the magnification of the microscope for observation is increased to obtain the necessary accuracy of alignment. However, there is the tendency for the area having the probes (i.e. the alignment determination area) to become larger because of the increase in semiconductor chip sizes for semiconductor devices because of the realization of high performance and simultaneous probing for multiple chips.

This tendency for the probing area to become larger results in the problem that the alignment of the probe with pads becomes difficult. This is because if the magnification of the microscope is increased, the entire probing area cannot be observed in the field of view of the microscope, and only partial observation is possible. On the other hand, if the magnification of the microscope is decreased in order to observe the entire probing area, it becomes difficult to obtain satisfactory accuracy for aligning the probes with the pads.

Because of the alignment determining area becoming larger due to increase in chip sizes and multiple probing as described above, there arise problems of the high magnification of the microscope resulting in difficulty of performing alignment, and of low magnification of the microscope resulting in lowered accuracy of alignment.

SUMMARY OF THE INVENTION

Accordingly, the object of the invention is to provide a conductive pattern for electric test of a semiconductor chip which can achieve the high accuracy alignment of probes with probing pads even if microscope observation at low magnification is employed in order to cover a large alignment determination area.

According to the present invention, there is provided a conductive pattern for electric test of a semiconductor chip with which probes are in contact, comprising a plurality of probing pads for electric test and at least two unit continuity check patterns provided within an area for determining alignment of the probes with said probing pads, each of the unit continuity check pattern comprising a plurality of conductive pads and a conductive line connecting the conductive pads.

By the use of the check pattern according to the present invention, since the alignment of a probe with a probing pad is conducted by detecting electrical continuity, a high accuracy of alignment is obtained even if a low magnification of a microscope is employed in order to enlarge the probing area.

Furthermore, since the alignment of probes with pads is determined by direct contact of the probes with the pads, the alignment accuracy of the probes and pads can be improved. In this case, the accuracy of alignment will be further improved if the widths of the conductive pads are made narrower than the widths of the probing pads.

DESCRIPTION OF THE PREFERRED EMBODIMENT

The preferred embodiments of the invention will now be described with reference to the accompanying drawings.

Figure 1:
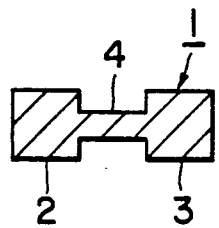
FIG. 1 is a plan view of a unit continuity check pattern according to an embodiment of the present invention.

FIG. 1 is a plan view showing an embodiment of a unit continuity check pattern 1 according to the present invention. This pattern is configured by two conductive pads 2 and 3 and a straight connecting line 4 connecting the two pads 2 and 3.

Figure 2:
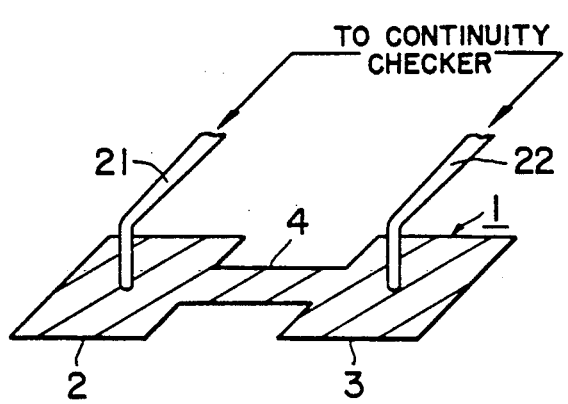
FIG. 2 is a perspective view of a probe aligning method using the continuity check pattern according to the present invention.

As shown in FIG. 2, probes 21 and 22 are placed in contact with the conductive pads 2 and 3 respectively, and the continuity between the probes 21 and 22 is checked by using a continuity checker (not shown). If continuity is observed, it is determined that the probes 21 and 22 and pads 2 and 3 are in correct contact, and it is assumed that if the probes 21 and 22 are in correct contact with the unit continuity check pattern 1, the probes 21 and 22 are in contact with the other probing pads provided in the periphery of a semiconductor chip.

Figure 11:
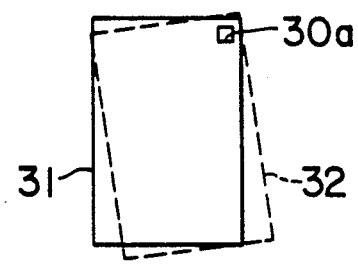
FIG. 11 is a plan view showing dislocation by rotation.

However, if the determination for alignment is conducted by one point within the alignment determination area, a misjudgment of alignment may occur when dislocation due to rotation is generated. That is, as shown in FIG. 11, when a unit check pattern 30a locates at the center of rotation, even if the alignment is determined as correct because continuity is observed at the continuity determination area, other probing pads may not be in contact with the probes.

Figure 3:
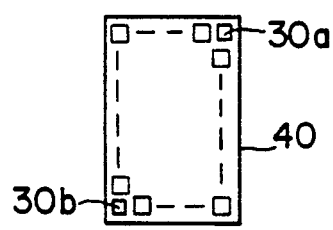
FIG. 3 is a plan view showing two continuity check patterns disposed in a semiconductor chip.

According to the present invention, correct alignment is achieved even if dislocation between probes and pads due to rotation occurs. For this purpose, as shown in FIG. 3, at least two unit check patterns 30a and 30b are provided in alignment determination area 40 which is an area of a semiconductor chip having a plurality of probing pads 7 for electric test.

Figures 4A, 4B, 4C, 4D, 4E:
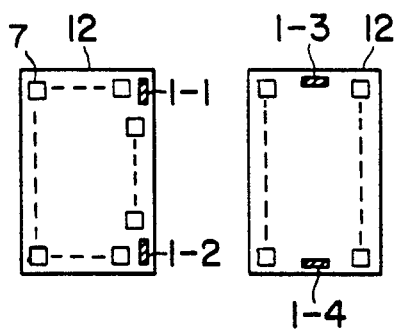
FIGS. 4A to 4E are plan views showing variations of dispositions of the unit continuity check patterns.

FIG. 4A to FIG. 4G are plan views showing embodiments of the present invention, in which a plurality of unit continuity check patterns are provided in the alignment determination area. FIG. 4A shows an embodiment in which two unit continuity check patterns 1-1 and 1-2 are provided on one side of a semiconductor chip, while FIG. 4B shows another embodiment of the present invention in which two unit continuity check patterns 1-3 and 1-4 are provided on the upper side and opposing bottom side of a semiconductor chip. FIG. 4C shows a further embodiment in which two unit continuity check patterns 1-3 and 1-5 are provided at two adjacent sides, FIG. 4D shows another embodiment in which three unit continuity check patterns 1-3, 1-4 and 1-5 are provided on three of the four sides of the chip and FIG. 4E shows a further embodiment in which four unit continuity check patterns 1-3, 1-4, 1-5 and 1-6 are provided on four sides of the semiconductor chip. Thus, since a plurality of unit continuity check patterns 1 are disposed in an alignment determination area, if the correct alignment is not achieved due to the occurrence of rotation, continuity is not observed at at least one check pattern of the check patterns 1-1 to 1-6.

Moreover, if continuity is not observed at at least one portion of a plurality of unit continuity check patterns, it is judged that probes and pads are not in correct alignment. Determination by using the continuity check pattern and actual alignment status of probes and probing pads will therefore be substantially the same and no erroneous judgement will occur.

Figure 5:
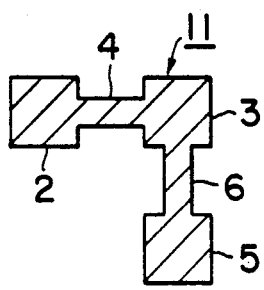
FIG. 5 is a plan view showing another embodiment of a unit continuity check pattern according to the present invention so as to be suitable for corners.

FIG. 5 shows another embodiment of a unit continuity check pattern which is suitable for corners of a semiconductor chip. This check pattern has a pad 5 below the pad 3 in addition to the configuration shown in FIG. 1. Rotation can be observed by one check pattern when this unit continuity check pattern is used.

Figure 6:
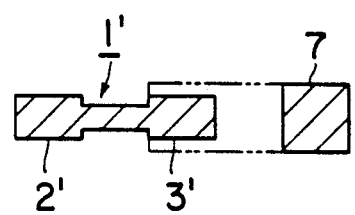
FIGS. 6 and 7 are plan views showing embodiments in which the pad widths are made narrower than other probing pads.
Figure 7:
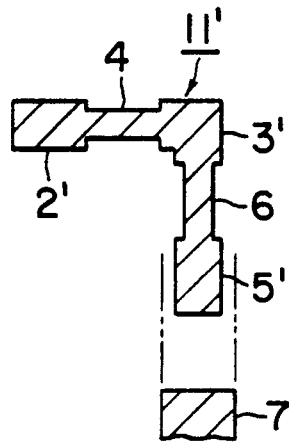

FIGS. 6 and 7 are embodiments of unit continuity check patterns according to the present invention, and correspond to the embodiments shown in FIG. 1 and FIG. 5, respectively. In these embodiments, since the widths of pads 2', 3' and 5' shown in FIGS. 6 and 7 are made narrower than the probing pad 7 which is actually probed, the alignment accuracy for other probing pads can be improved.

Figure 8:
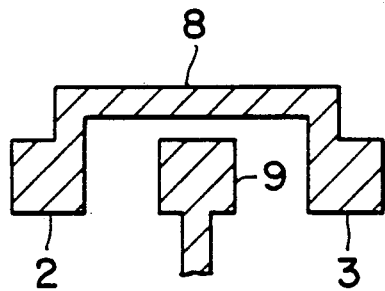
FIG. 8 is a plan view showing a further embodiment of a unit continuity check pattern according to the present invention, in which a probing pad is disposed between two pads of the check pattern.

It is not always necessary to connect adjacent pads 2 and 3 through connecting line 4. Therefore, another embodiment is possible as shown in FIG. 8, where an actual probing pad 9 is disposed between the continuity check pads 2 and 3 connected by a connecting line 8.

In the above-mentioned embodiments, the unit check patterns are formed using pads which are not used for actual probing, but pads for actual probing can be used as continuity check pads.

Figure 9:
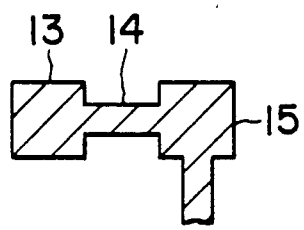
FIG. 9 is a plan view showing a further embodiment of a unit continuity check pattern connected to a probing pad.

FIG. 9 shows such an embodiment in which a conductive pad 13 is connected to a pad 15 used for actual probing. In this embodiment, the fact that the pad 15 is connected to the pad 13 does not adversely affect the result of probing.

Furthermore, though, in FIGS. 1, 6, 8 and 9, pads for continuity check are latitudinally elongated, they can be rotated 90 degrees and longitudinally elongated. Continuity check patterns shown in FIGS. 5 and 7 can be disposed by rotating 90 degrees or 180 degrees to locate them at every corner.

It is to be noted that only one continuity check pattern is sufficient in the case where no rotation between probes and pads is ensured, for example, in the case where there has been previous calibration for the rotation between a fixture for probes and a fixing stage for a wafer on which semiconductor chips are formed.

Figure 10:
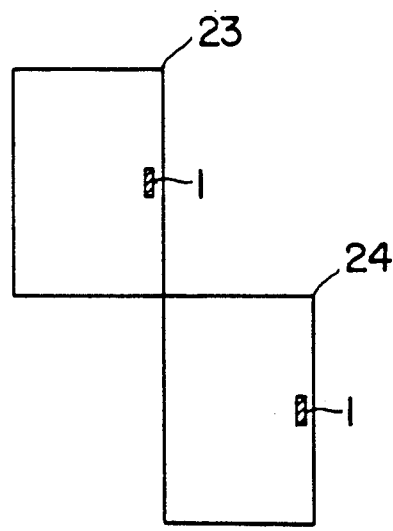
FIG. 10 is a plan view showing a further embodiment in which two unit continuity check patterns are disposed in two chips.

When a plurality of semiconductor chips are probed, a plurality of probing patterns need not necessarily be formed in a semiconductor chip. That is, when there is simultaneous probing for two semiconductor chips 23 and 24 having pads to be probed, as shown in FIG. 10, the unit continuity check patterns 1 are disposed to both semiconductor chips 23 and 24. In this case, since two continuity check patterns are provided in the area having the probes, an appropriate alignment between the probes and the pads is achieved.

What is claimed is:

1. A conductive pattern for electric test of a semiconductor chip with which probes are in contact, comprising:
   a plurality of probing pads formed on a layer of said semiconductor chip for carrying out electric testing of said semiconductor chip by contacting said probing pads with said probes; and
   at least two unit continuity check patterns provided on said layer of said semiconductor chip at predetermined locations relative to said probing pads for judging whether said probes and said probing pads are in precise alignment,
   each of said unit continuity check patterns comprising a plurality of conductive pads and a conductive line connecting said pads.

2. A conductive pattern for electric test as set forth in claim 1, wherein said conductive pads of said unit continuity check pattern are provided separately from said probing pads.

3. A conductive pattern for electric test as set forth in claim 1, wherein one of conductive pads of said unit continuity check pattern is provided in common to a probing pad.

4. A conductive pattern for electric test as set forth in claim 1, wherein at least said two unit continuity check patterns are disposed at one side of said semiconductor chip.

5. A conductive pattern for electric test as set forth in claim 1, wherein said unit continuity check patterns are disposed on at least two of four sides of said semiconductor chip.

6. A conductive pattern for electric test as set forth in claim 1, wherein said unit continuity check pattern has a first conductive pad, a second conductive pad disposed in longitudinal direction and a third conductive pad disposed in lateral direction.

7. A conductive pattern for electric test as set forth in claim 1, wherein widths of said conductive pads are smaller than those of said probing pads.

8. A conductive pattern for electric test as set forth in claim 1, wherein at least one probing pad is disposed between two conductive pads.

9. A conductive pattern for electric test as set forth in claim 1, wherein said unit continuity check patterns are disposed to different semiconductor chips.

* * * * *